(12) United States Patent
Iwamoto et al.

(10) Patent No.: US 6,259,147 B1
(45) Date of Patent: *Jul. 10, 2001

(54) SEMICONDUCTOR DEVICE HAVING A FUSE LAYER

(75) Inventors: Takeshi Iwamoto; Rui Toyota; Kaoru Motonami; Yasuhiro Ido; Masatoshi Kimura; Kakutaro Suda; Kazuhide Kawabe; Hideki Doi; Hiroaki Sekikawa, all of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/226,161

(22) Filed: Jan. 7, 1999

(30) Foreign Application Priority Data

Jun. 19, 1998 (JP) .................................................. 10-173120

(51) Int. Cl.⁷ ............................ H01L 29/00; H01L 27/10; G11C 17/00
(52) U.S. Cl. ............................ 257/529; 257/209; 365/96; 365/225.7
(58) Field of Search .................................. 257/529, 530, 257/209; 365/96, 225.7

(56) References Cited

U.S. PATENT DOCUMENTS 5,589,706  12/1996  Mitwalsky et al. ................ 257/529
5,636,172 *  6/1997  Prall et al. ......................... 365/225.7
5,773,869 *  6/1998  Froehner ............................... 257/529
5,851,903 * 12/1998  Stamper ................................ 438/467
5,914,524 *  6/1999  Komenaka ........................... 257/529
5,949,323 *  9/1999  Huggins et al. ..................... 337/401

FOREIGN PATENT DOCUMENTS 7-263558  10/1995  (JP) .
9-017960   1/1997  (JP) .
9-213804   8/1997  (JP) .

OTHER PUBLICATIONS

Robert C. Weast, Ph.D., CRC Handbook of Chemistry and Physics, 57th Edition, p. B–171, Nov. 1976.*

* cited by examiner

Primary Examiner—Eddie Lee
Assistant Examiner—Allan R. Wilson
(74) Attorney, Agent, or Firm—McDermott, Will & Emery

(57) ABSTRACT

A semiconductor device includes: an insulation layer; a fuse layer extending on the insulation layer in one direction and disconnected through light radiation to control a redundant circuit; a pseudo fuse layer on the insulation layer along at least one side of the fuse layer; another insulation layer covering the fuse layer and the pseudo fuse layer; and a protection film formed on another insulation layer and having an opening in a region opposite to the fuse layer. Fuse layers having a spacing of less than 4 μm or 4.5 to 5.5 μm. Such a structure allows a semiconductor device with a fuse layer capable of being disconnected reliably and providing a smaller blow trace.

6 Claims, 13 Drawing Sheets

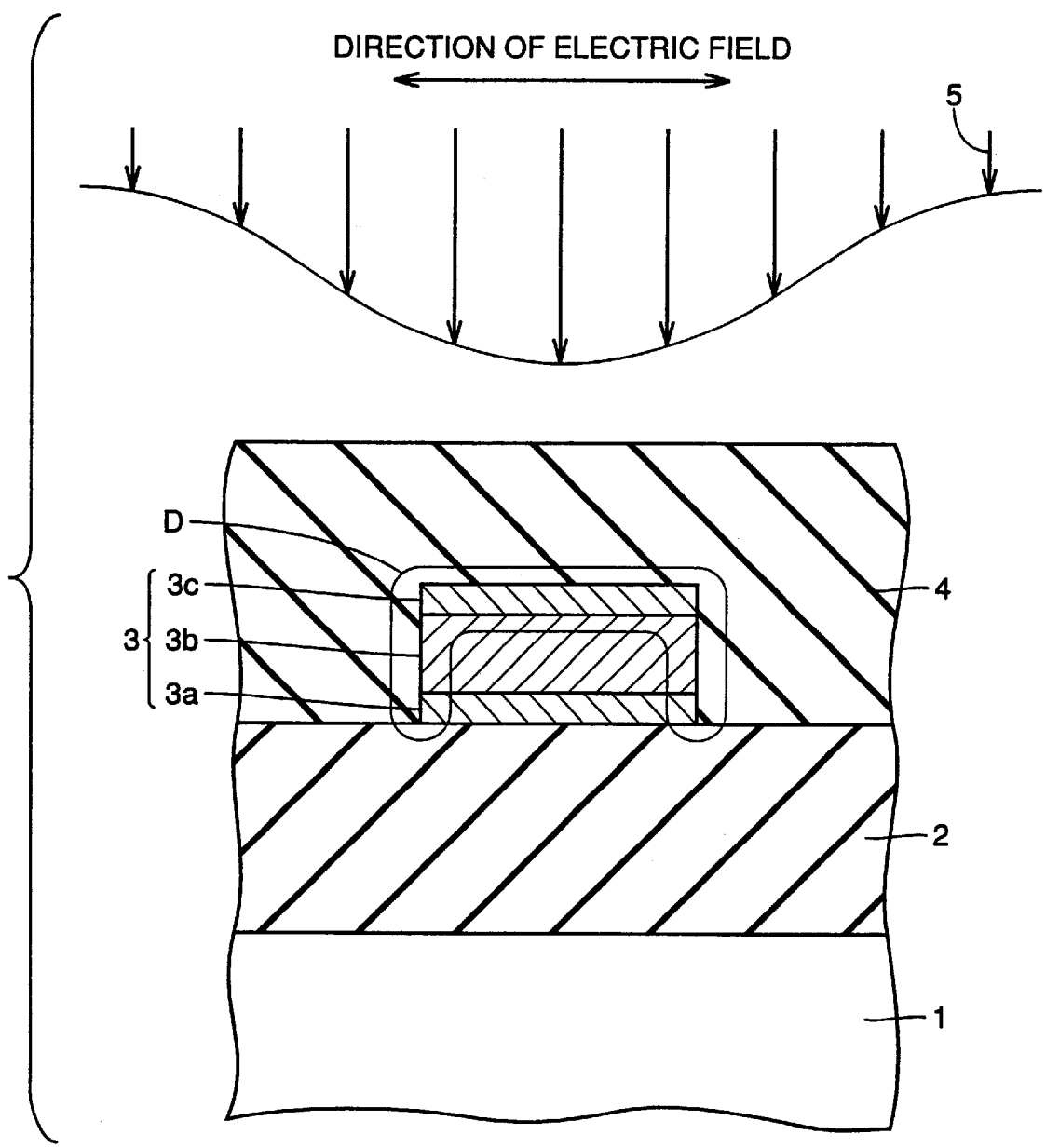

GEOMETRICAL RELATION BETWEEN FUSE LAYER 3
AND THE INCIDENT ANGLE OF LASER LIGHT 5

RELATION BETWEEN REFLECTANCE AND INCIDENT ANGLE

SEMICONDUCTOR DEVICE HAVING A FUSE LAYER

BACKGROUND OF THE INVENTION

1. Field of the Invention

The present invention relates to semiconductor devices and more specifically to the structures of semiconductor devices having a fuse layer disconnected through light radiation so as to control a redundant circuit.

2. Description of the Background Art

It has been well known to provide a redundant circuit for recovering semiconductor devices from defects. In general, a fuse layer is formed together with the redundant circuit. The fuse layer that is disconnected as appropriate allows a defective circuit to be replaced by the redundant circuit. A semiconductor device with such a fuse layer is disclosed e.g. in U.S. Pat. No. 5,589,706.

FIG. 19 shows a schematic configuration of a dynamic random access memory (DRAM) as one example of a semiconductor device with a redundant circuit. Referring to FIG. 19, a memory cell array 20 includes a word line WL extending in a row direction from a row decoder 21 via a word driver 22, and a bit line BL extending in a column direction from a column decoder 23. Word line WL and bit line BL are crossed with each other. A memory cell MC is provided at a crossing of word line WL and bit line BL.

Outside word line WL, a spare word line SWL extends in the row direction from a spare decoder 24 via a spare word driver 25. A spare memory cell SMC is provided at a crossing of spare word line SWL and each bit line BL.

Spare memory cell SMC, spare decoder 24 and spare word driver 25 configure a redundant circuit. Spare decoder 24 connects with a defective-address comparing circuit 26 in which a fuse layer is formed. The fuse layer controls the redundant circuit. Defective-address comparing circuit 26 receives row addresses. FIG. 20 shows a fuse layer of a DRAM configured as above and a vicinity of the fuse layer in cross section.

Referring to FIG. 20, a fuse layer 3 is formed on a semiconductor substrate 1, with an interlayer insulation film 2 interposed therebetween. Fuse layer 3 is covered by an insulation layer 4 formed e.g. of silicon oxide film.

A defective circuit is recovered by disconnecting fuse layer 3 configured as described above. In general, laser light is employed to disconnect fuse layer 3. The principle of the disconnection of fuse layer 3 through laser light will now be described.

Referring again to FIG. 20, laser light 5 illuminates fuse layer 3. Thus, laser light 5 is absorbed by fuse layer 3 and fuse layer 3 is thus heated. Consequently, fuse layer 3 changes in phase from solid to liquid to gas. Thus, the evaporation pressure of fuse layer 3 pushes isolation layer 4 upwards to create a crack 9 in isolation layer 4, as shown in FIG. 21.

When the evaporation pressure of fuse layer 3 exceeds a predetermined value, fuse layer 3 is disconnected and insulation layer 4 overlying fuse layer 3 is blown away to create a blow trace 4a, as shown in FIG. 22.

Conventional fuse layers are often designed in view of electrical characteristics, processing convenience and the like. Accordingly, in shifting to semiconductor devices having a structure of a new generation, a member totally different from that of the previous generation can be adopted as a fuse layer, a plurality of fuse layers provided can each have a different dimension, and each fuse layer can be surrounded by an oxide film having a different thickness. As a result, blow traces created by fuse layer disconnection cannot have a uniform dimension and this results in a disadvantage that a fuse layer can not be disconnected reliably.

Furthermore, it has been increasingly difficult to disconnect an underlying fuse layer due to high integration of elements configuring a semiconductor device and to an increased film thickness associated with a reduced number of the steps of the process for manufacturing the same. Currently, an interconnection layer located as high as possible is increasingly used as a fuse layer.

The interconnection layer located as high as possible is formed mainly of metal material. It has been known, however, that metal material increases the reflection of illumination light from the interconnection layer in transferring an interconnection pattern onto the interconnection layer and the interconnection pattern cannot be transferred satisfactorily. To address this disadvantage, a film is provided on the surface of the interconnection layer to reduce the reflection of illumination light.

An anti-diffusion film is also provided between the semiconductor substrate and the interconnection layer of metal to prevent the ions of the silicon of the semiconductor substrate from diffusing into the interconnection layer. From the reason provided above, a three-layered structure is frequently used for the interconnection layer adopted as a fuse layer.

The fuse layer structured of three layers is, however, structurally not preferable in disconnecting the fuse layer. Furthermore, the region provided with the fuse layer is lower in interconnection density than a memory region. As a result, if the process for forming an interconnection layer in the memory region is similar to that for forming an interconnection layer in the fuse layer, the cross section of the fuse layer varies from location to location due to the low interconnection density.

Furthermore, when the beam wavelength of the laser light illuminating the fuse layer is approximately equal in dimension to the width of the fuse layer and the beam diameter of the laser light is larger than the width of the fuse layer, the profile of the light absorbed by the fuse layer significantly depends on the shape of the fuse layer and this results in a very complicated profile of the light absorbed by the fuse layer.

The laser light absorption into the fuse layer allows the optical energy of the laser light to be transformed into thermal energy so that the fuse layer changes in phase from solid to liquid to gas and the fuse layer is thus disconnected. While the light-absorption profile corresponds to heat-emission profile, it is difficult to reliably disconnect the fuse layer and obtain a smaller blow trace depending on the structure of the fuse layer when the heat-emission profile of the fuse layer is a profile which is not suitable for disconnecting the fuse layer.

SUMMARY OF THE INVENTION

The present invention has been made to overcome the disadvantages described above.

One object of the present invention is to provide a semiconductor device having a fuse layer capable of being disconnected reliably and providing a smaller blow trace.

Another object of the present invention is to miniaturize the semiconductor device.

A semiconductor device according to the present invention includes a first insulation layer, a plurality of fuse layers extending on the insulation layer in one direction and disconnected through light illumination to control a redundant circuit, a pseudo fuse layer provided on the first insulation layer along at least one side of the fuse layer, a second insulation layer formed to cover the fuse layers and the pseudo fuse layer, and a protection film formed on the second insulation layer and having an opening at a region opposite to the fuse layers. The fuse layers have a spacing of less than 4 $\mu$m or 4.5 $\mu$m to 5.5 $\mu$m.

In transferring an interconnection pattern for the fuse layers, the pseudo fuse layer thus provided allows any deformation in cross section of the interconnection pattern that would be otherwise caused at a surface of low interconnection density to be caused at the pseudo fuse layer rather than the fuse layers. Since the pseudo fuse layer is not disconnected through light illumination, there will not be any disadvantage caused if such a deformation of an interconnection pattern is caused at the pseudo fuse layer.

In the fuse layer disconnection, the fuse layers that are uniformed in cross section and have a spacing of less than 4 $\mu$m or 4.5 $\mu$m to 5.5 $\mu$m can allow for reliable disconnection of the fuse layers and uniform blow traces.

Preventing the enlargement of a blow trace of a fuse layer that is caused at a surface of low interconnection density, can reduce the dimensions of the opening provided in the production film formed on the second insulation film covering the fuse layers. As a result, the area required for the opening can be reduced and hence the semiconductor device can be miniaturized. The opening reduced in dimension renders it difficult for water and the like to enter the semiconductor device and can thus improve the water resistance of the semiconductor device.

The structure as described below is adopted so as to provide the present invention in more preferable condition.

The surface of the pseudo fuse layer opposite to that surface of the pseudo fuse layer which faces the fuse layers is inclined such that the pseudo fuse layer tapers upwards.

Since any deformation in an interconnection pattern for the fuse layers that would be otherwise caused at a surface of low interconnection density in transferring the interconnection pattern is caused at the pseudo fuse layer, the fuse layers can be uniform in cross section.

The fuse layers are each structured of at least two stacked layers, with a layer of a material with a relatively high boiling point provided as a surface layer. The pseudo fuse layer has the same structure as the fuse layers.

Still preferably, the fuse layers and the pseudo fuse layer are each formed of the three layers of a nitride layer, a metal layer and a nitride layer. The boiling point of the nitride layer is higher than that of a material for the metal layer. Such a structure allows the fuse layers to be patterned precisely.

Still preferably, the width of the pseudo fuse layer is equal to or smaller than that of the fuse layers. Furthermore, that sidewall of the opening provided in the protection film which is opposite to a side of the fuse layer is located between the surface of the fuse layer opposite to the pseudo fuse layer and the surface of the pseudo fuse layer opposite to the fuse layer.

Such a structure contemplates area reduction of the region required for the opening provided in the protection film formed on the second insulation layer covering the fuse layers and hence miniaturization of the semiconductor device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a cross section for illustrating a profile of heat emission when laser light linearly polarized) illuminates a fuse layer such that the laser light is polarized perpendicular to the fuse layer.

DESCRIPTION OF THE PREFERRED EMBODIMENTS

A semiconductor device according to an embodiment of the present invention will now be described with reference to the drawings. The background art leading to the present invention will now be described in order to fully understand the structure of the semiconductor device according to the present embodiment.

The structure of the semiconductor device with a fuse layer will now be described with reference to FIGS. 1–4.

Figure 1:
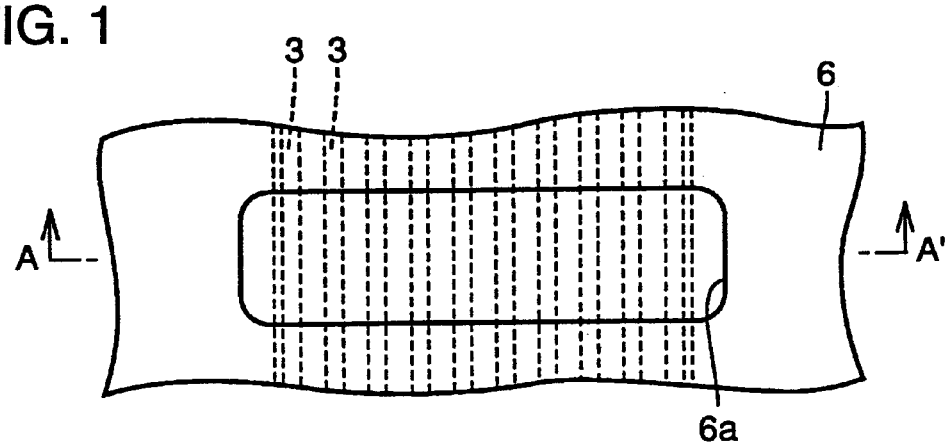
FIG. 1 is a plan view of a semiconductor device with fuse layers in the background art.
Figure 2:
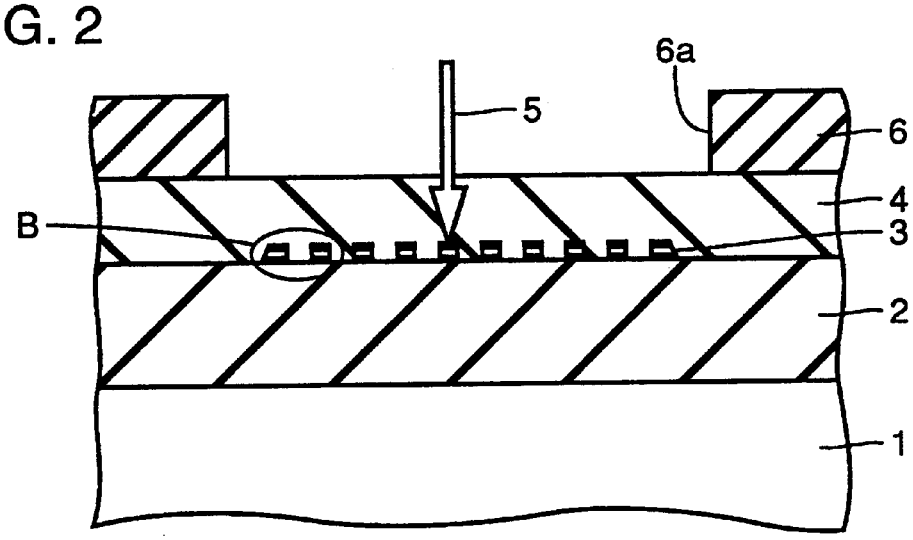
FIG. 2 is a cross section taken along line A–A' of FIG. 1.
Figure 3:
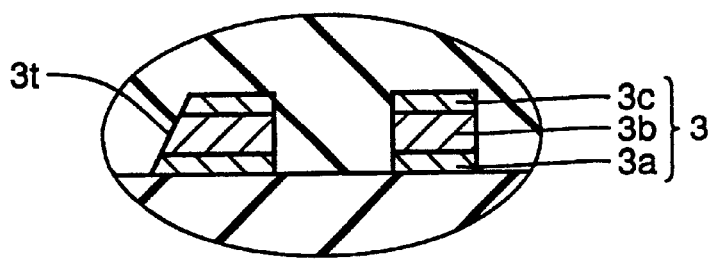
FIG. 3 is an enlarged partial cross section of a portion B shown in FIG. 2.

An oxide film 2 is formed on a semiconductor substrate 1. On oxide film 2 is formed a plurality of fuse layers 3 having a predetermined profile in cross section. As shown in FIG. 3, fuse layer 3 is structured by the three layers of a nitride layer 3a to prevent the ions of the silicon of semiconductor substrate 1 from diffusing into fuse layer 3, a metal layer 3b as an interconnection layer and a nitride layer 3c serving as an anti-reflection film.

On fuse layers 3 is formed an insulation layer 4 covering fuse layers 3. On insulation layer 4 is provided a protection film 6 provided with an opening 6a located above fuse layers 3.

Figure 4:
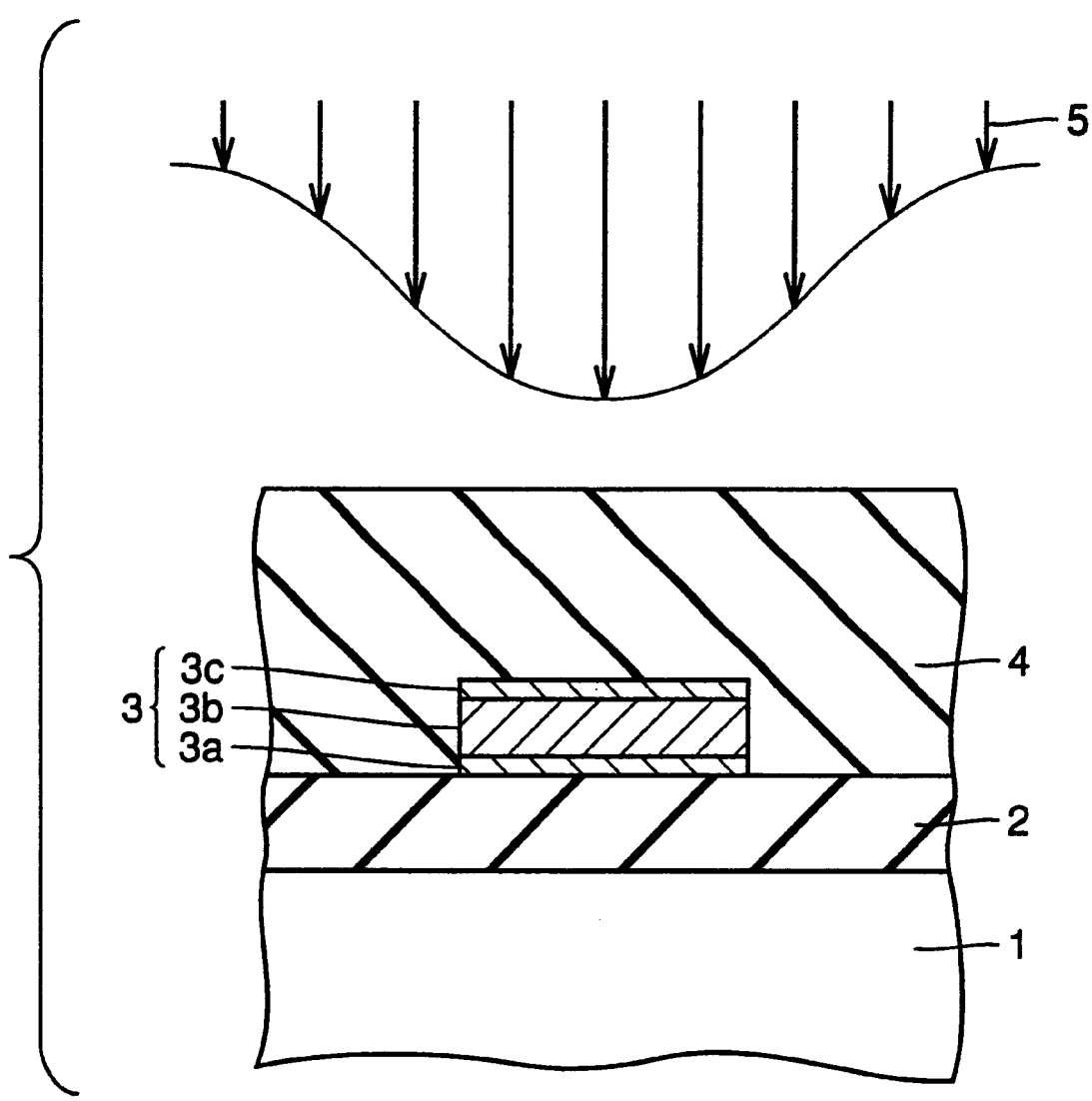
FIG. 4 is an enlarged cross section of one fuse layer.

Disconnection of fuse layer 3 will now be described with reference to FIG. 4. Laser light 5 illuminates fuse layer 3 from above insulation layer 4. Thus laser light 5 is absorbed by fuse layer 3 so that fuse layer 3 is heated. Consequently, fuse layer 3 changes in phase from solid to liquid to gas. Thus, the evaporation pressure of fuse layer 3 pushes insulation layer 4 upwards. When the evaporation pressure of fuse layer 3 exceeds a predetermined value, fuse layer 3 is disconnected and insulation layer 4 on fuse layer 3 is blown away to form a blow trace.

As has been described above, fuse layer 3 is often structured by three layers or multiple layers. This results in an uneven profile of the laser light absorbed by fuse layer 3. Furthermore, the heat conduction resulting from the laser light absorption by fuse layer 3 is also complicated, since the film which forms a layer has a different physical property with respect to heat.

A relation between a direction of an electric field of laser light and a cross-sectional profile of a fuse layer will now be described with reference to FIGS. 5–11.

The surface of fuse layer 3 is covered with a material with a complex index of refraction $m=n-i \times k$, wherein the square of a real-number term n minus the square of an imaginary-number term k ($n^2-k^2$) has a negative value. Fuse layer 3 is adapted to have a rectangular cross-section.

Figure 5:
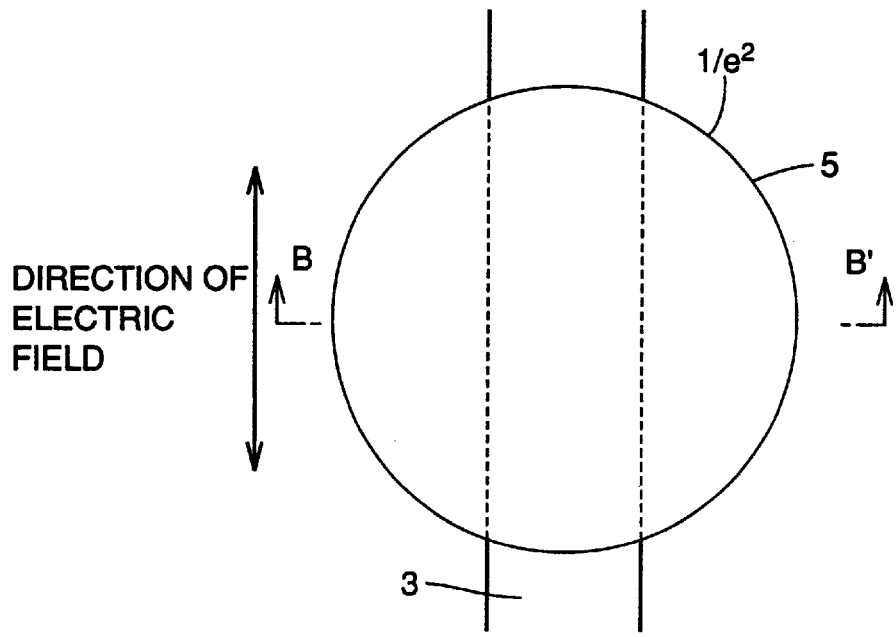
FIG. 5 is a plan view when laser light (linearly polarized) illuminates a fuse layer such that the laser light is polarized parallel to the fuse layer.
Figure 6:
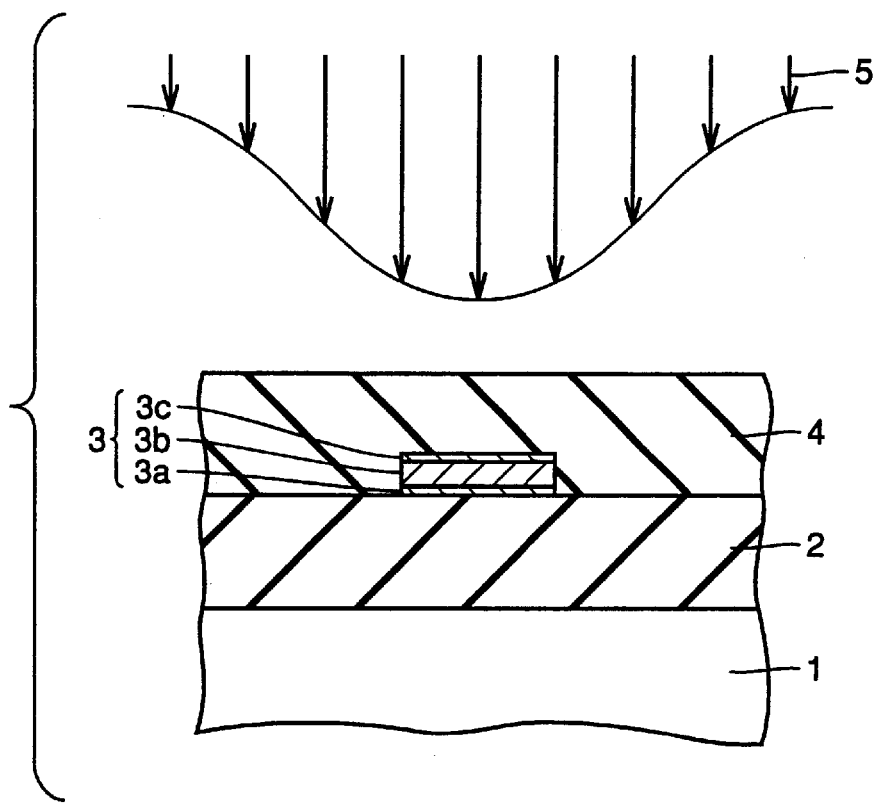
FIG. 6 is a cross section taken along line B–B' of FIG. 5.
Figure 7:
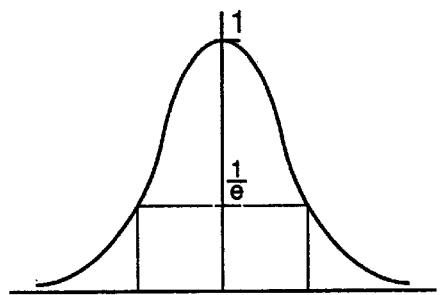
FIG. 7 represents a light-intensity profile of laser light.
Figure 8:
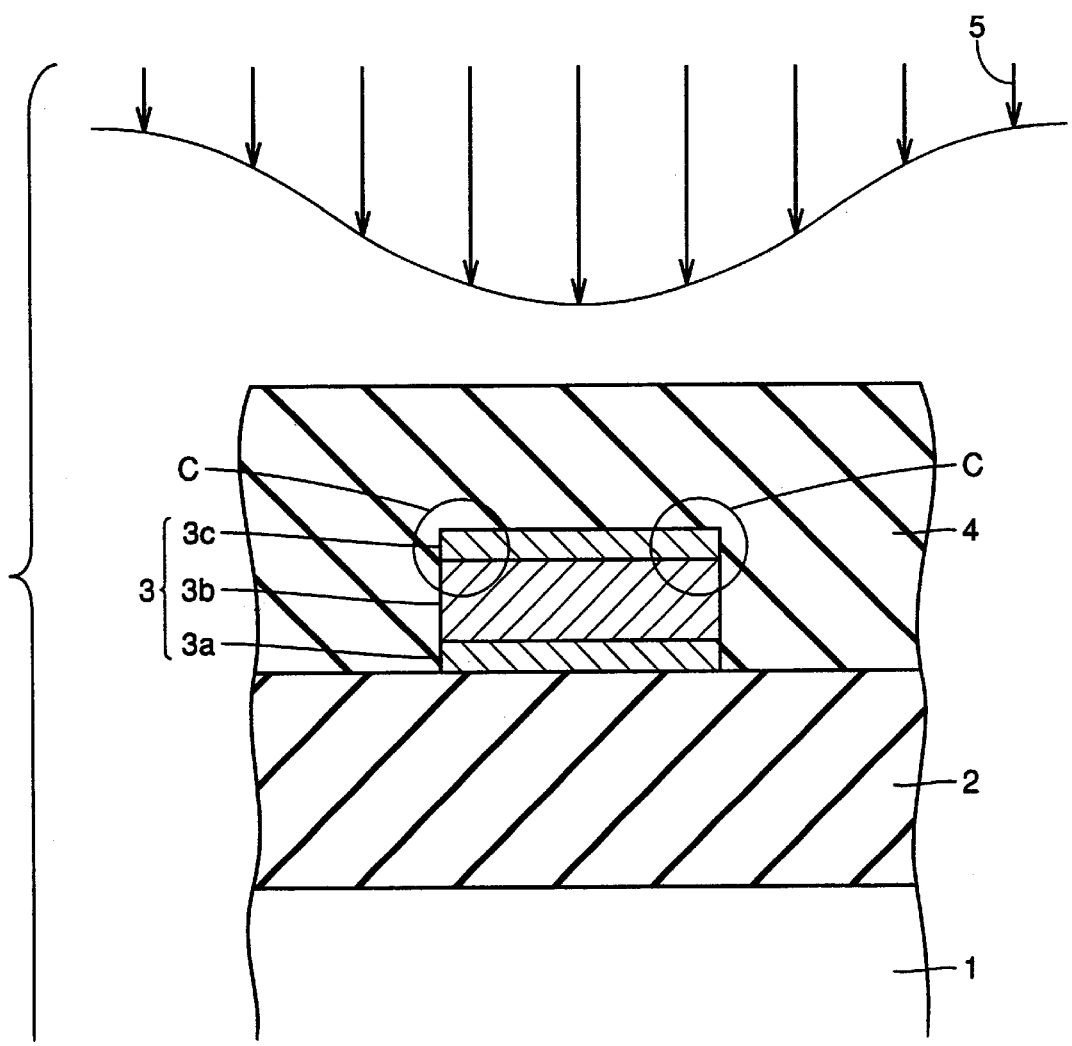
FIG. 8 is a cross section for illustrating a profile of heat emission when laser light (linearly polarized) illuminates a fuse layer such that the laser light is polarized parallel to the fuse layer.
Figure 9:
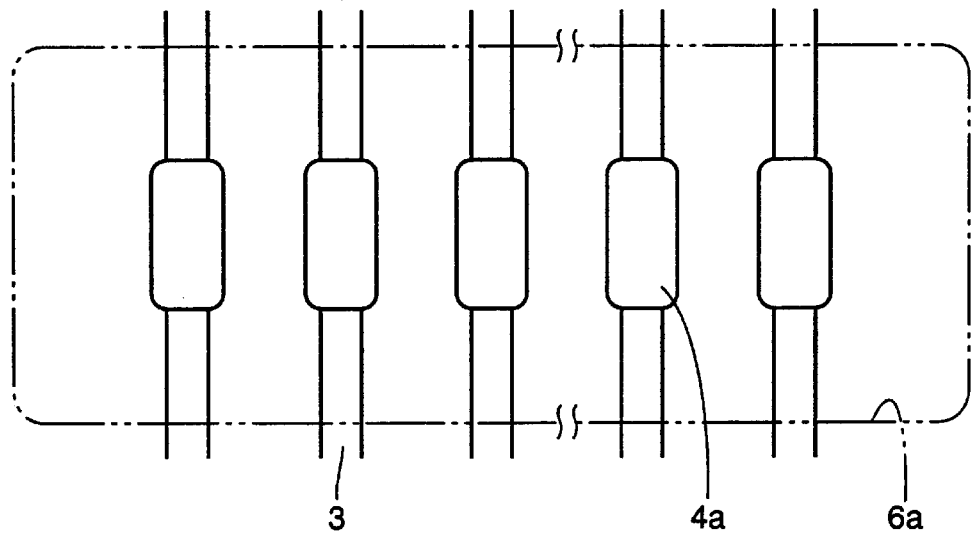
FIG. 9 is a plan view showing a shape of a blow trace for parallel polarization.

Under the conditions provided as above, if the direction of the electric field of laser light 5 (linearly polarized) illuminating fuse layers 3 substantially corresponds to the longitudinal direction of fuse layer 3 (parallel polarization), as shown in FIGS. 5 and 6, such laser light 5 absorption is profiled that an edge (circled and labeled as C in the figure) of fuse layer 3 absorbs most of laser light 5, as shown in FIG. 8.

Since the light-absorption profile corresponds to heat-emission profile, the edge of fuse layer 3 reaches its boiling point in a short period of time and fuse layer 3 is thus disconnected. It should be noted that laser light 5 shown in FIG. 5 is adapted to have a beam diameter corresponding to a region of $1/e^2$ in the laser-light intensity profile shown in FIG. 7.

While the rapidly increased temperature allows fuse layer 3 to be disconnected, the time required for the disconnection of fuse layer 3 is approximately 10 ns, which is too short a period of time to soften a large portion of the surrounding oxide film through heat conduction. As a result, a blow trace 4a created in insulation layer 4 that is associated with the disconnection of fuse layer 3 has a substantially rectangular profile, as shown in the plan view of FIG. 9. This allows a reduced spacing between the fuse layer 3 interconnections and hence a reduced area of opening 6a provided in protection film 6.

When the direction of the electric field of laser light 5 (linearly polarized) illuminating fuse layer 3 is substantially orthogonal to the longitudinal direction of fuse layer 3 (orthogonal polarization), there is a laser light 5 absorption profile provided that is different from that for parallel polarization. More specifically, laser light 5 is absorbed at the upper and side surfaces of fuse layer 3 (i.e. the region denoted as D in the figure), as shown in FIG. 10. The light-absorption profile corresponds to heat-emission profile and the temperature of fuse layer 3 is thus prevented from increasing only at a specific portion. Thus the temperature of fuse layer 3 increases gradually.

The gradual elevation of the temperature of fuse layer 3 expands that region of insulation layer 4 surrounding fuse layer 3 which is softened. As a result, blow trace 4a created in insulation layer 4 that is associated with the disconnection of fuse layer 3 has a large, ellipsoidal profile, so that the spacing between fuse layer 3 interconnections and hence the area of opening 6a provided in protection film 6 cannot be reduced.

It is thus preferable that the direction of the electric field of laser light 5 substantially correspond to or be polarized substantially parallel to the longitudinal direction of fuse layer 3 in irradiating fuse layer 3 with laser light 5 to disconnect fuse layer 3.

While the parallel polarization allows the reduction in the spacing between fuse layer 3 interconnections and hence the reduction of the area of opening 6a provided in protection film 6, it is often difficult to irradiate all fuse layers 3 with laser light 5 through parallel polarization.

Accordingly, in practice, fuse layer 3, which is dominantly formed of a material having a boiling point of less than 3000K, is illuminated and disconnected by laser light 5 through circular polarization in view of the fact that fuse layers 3 arranged in various directions have different longitudinal directions and of the rectangularity of blow trace 4a, since circular polarization has characteristics intermediate between parallel polarization and orthogonal polarization.

Figure 11:
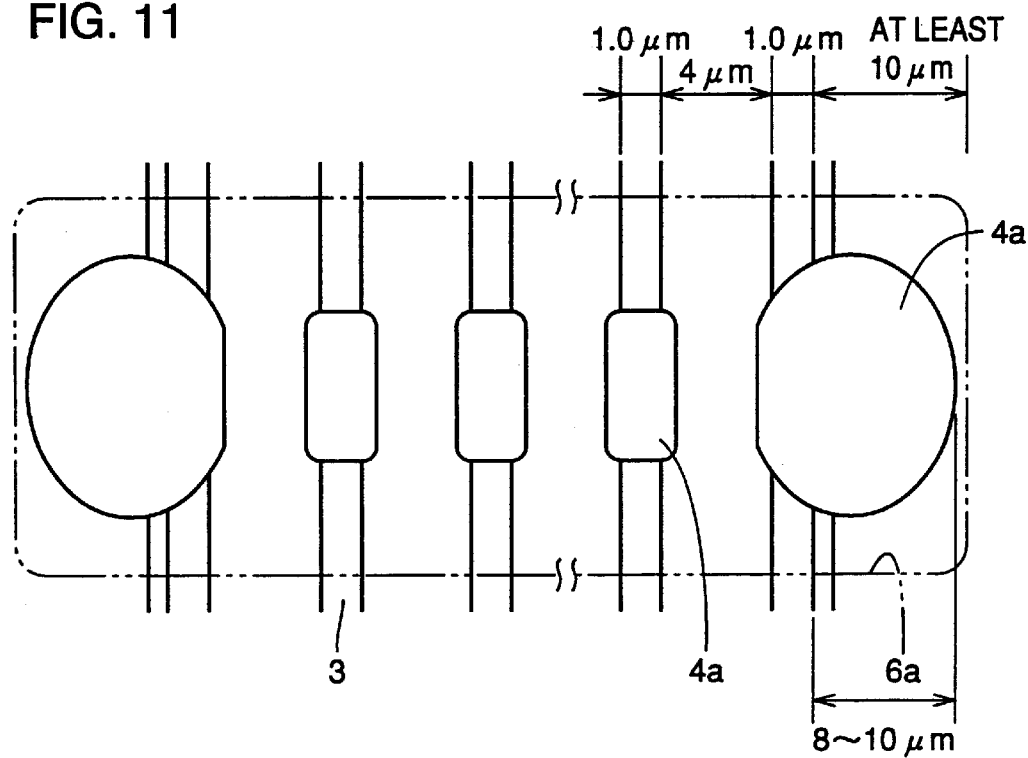
FIG. 11 is a plan view showing a shape of a blow trace for circularly polarized light.

The circularly polarized laser light 5 illuminating fuse layer 3, however, causes the problem as described below. The profile of blow traces 4a created when circularly polarized light is employed to disconnect fuse layers 3 varies, as shown in FIG. 11, even if fuse layers 3 are formed in the same opening 6a. More specifically, a fuse layer 3 located at the center of opening 6a has a substantially rectangular blow trace 4a, whereas a fuse layer 3 located at an end of opening 6a has a blow trace 4a the profile of which is similar to an extremely large, half moon.

For example, when fuse layers 3 have a width of 1.0 μm and a spacing of 4 μm, blow trace 4a protrudes from an end surface of fuse layer 3 by approximately 8 μm to 10 μm. Accordingly, a distance of at least 10 μm is required between the end surface of fuse layer 3 and the end of opening 6a. This disadvantageously prevents reduction of the area of opening 6a and hence miniaturization of the semiconductor device.

The following is the reason why blow trace 4a of fuse layer 3 located at an end of opening 6a has such a profile as described above.

It has been known as an empirical fact in the process for patterning fuse layer 3 that fuse layer 3 for a region of high interconnection density is patterned according to the transferred pattern, whereas fuse layer 3 for a region of low interconnection density is not patterned according to the transferred pattern and consequently an inclined surface 3t is formed so that fuse layer 3 is gradually tapered upwards, as shown in the enlarged cross section in FIG. 3.

A phenomenon caused when laser light 5 illuminates inclined surface 3t of fuse layer 3 will also be described with reference to FIGS. 12A and 12B.

Figure 12A:
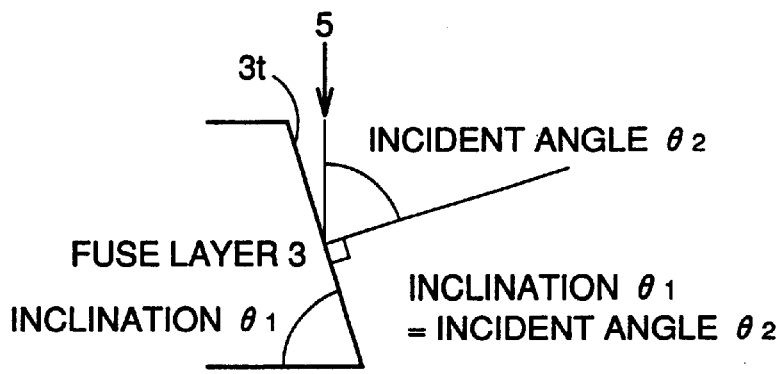
FIG. 12(A) is a schematic diagram showing a geometrical relation between a fuse layer 3 and an incident angle of laser light 5.

FIG. 12(A) is a schematic diagram showing a geometrical relation between fuse layer 3 and an incident angle of laser light 5, wherein an inclination θ1 of inclined surface 3t of fuse layer 3 is equal to an incident angle θ2 of laser light 5 on inclined surface 3t.

Figure 12B:
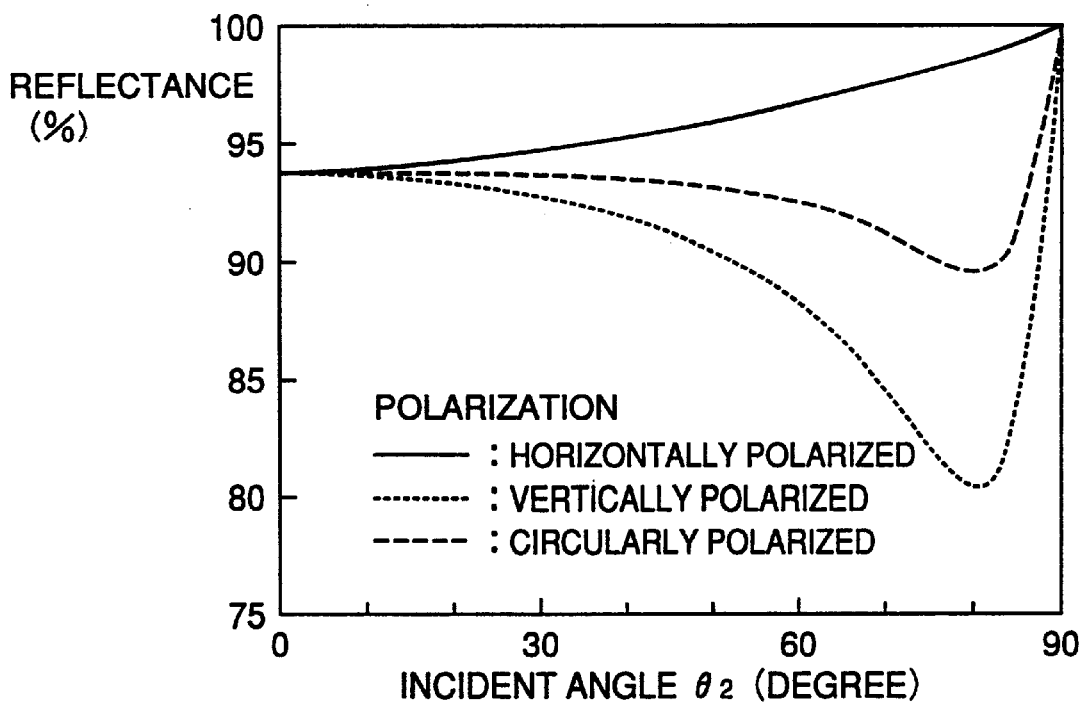
FIG. 12(B) is a graph of the reflectance of laser light 5 off an inclined surface 3$t$ versus an incident angle $\theta$2.

FIG. 12(B) is a graph of the reflectance of laser light 5 off inclined surface 3t versus incident angle θ2. For laser light 5 polarized horizontally, the reflectance increases as the value of incident angle θ2 increases.

For laser light 5 polarized vertically, the reflectance decreases as the value of incident angle θ2 increases. In particular, the reflectance significantly drops when incident angle θ2 exceeds 60°, and the reflectance is minimized when incident angle θ2 is approximately 80°. The reflectance for laser light 5 circularly polarized is similar in profile to that for laser light 5 vertically polarized, although smaller in variance.

Thus, when inclined surface 3t is illuminated with laser light 5 circularly polarized, the temperature at the vicinity of inclined surface 3t increases gradually and fuse laser 3 is thus disconnected, as is similar with laser light 5 polarized vertically.

The gentle temperature elevation expands that region of insulation layer 4 surrounding inclined surface 3t which is softened. Thus, blow trace 4a profiled like a half moon is created in insulation layer 4 surrounding inclined surface 3t when fuse layer 3 is disconnected.

Figure 13:
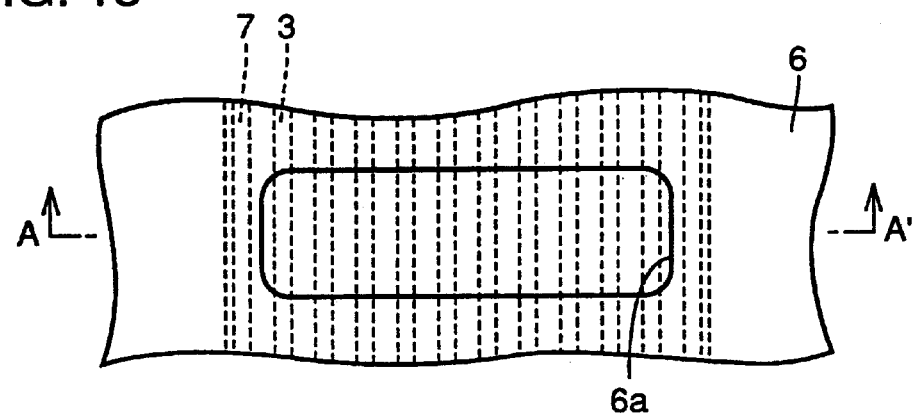
FIG. 13 is a plan view of a semiconductor device with fuse layer 3 according to an embodiment of the present invention.
Figure 14:
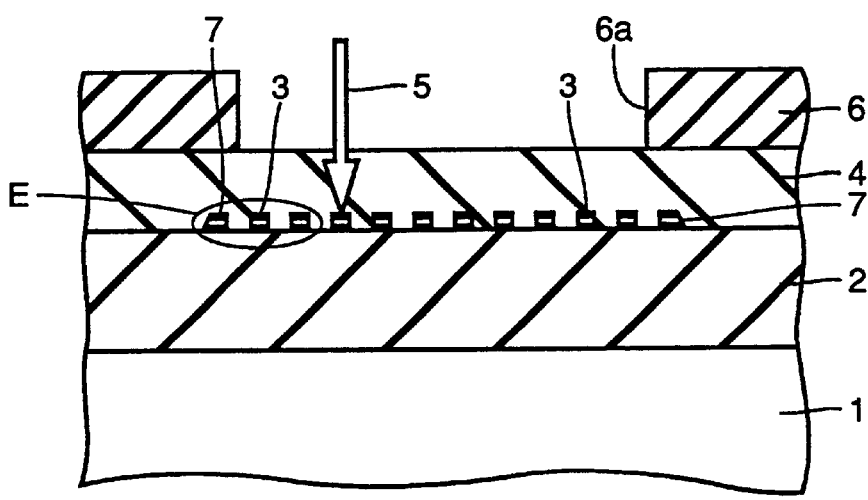
FIG. 14 is a cross section taken along line A–A' of FIG. 13.

Based on the background art described above, the structure described hereinafter is applied to a semiconductor device according to an embodiment of the present invention. This structure will now be described with reference to FIGS. 13–15.

Figure 15:
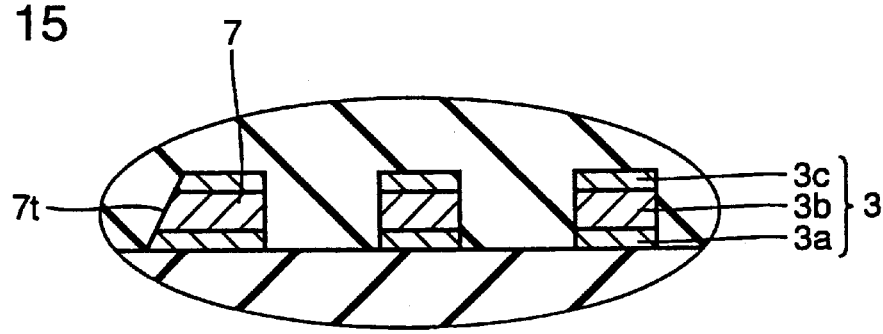
FIG. 15 is an enlarged partial cross section of a portion E shown in FIG. 14.

The semiconductor device according to the present embodiment has an oxide film 2 formed on a semiconductor substrate 1. On oxide film 2 is formed a fuse layer 3 having a predetermined profile in cross section. Fuse layer 3 is configured of the three layers of a nitride layer 3a to prevent the ions of the silicon of semiconductor substrate 1 from diffusing into fuse layer 3, a metal layer 3b as an interconnection layer, and a nitride layer 3c serving as an antireflection film, as shown in FIG. 15.

On fuse layer 3 is formed an insulation layer 4 covering fuse layer 3. On insulation layer 4 is formed a protection film 6 having an opening 6a located above fuse layer 3.

A pseudo fuse layer 7, which is not used for replacing a defective circuit with a redundant circuit, is provided in a region outside fuse layers 3 provided inside the same opening 6a formed in protection film 6.

Since pseudo fuse layer 7 is formed simultaneously in the process for patterning fuse layer 3, pseudo fuse layer 7 has the same layered structure as that of fuse layer 3. Since one side surface of pseudo fuse layer 7 faces a region of low interconnection density, inclined surface 3t, which has been conventionally formed inevitably on fuse layer 3, is formed as an inclined surface 7t on pseudo fuse layer 7, as shown in FIG. 15.

Figure 16:
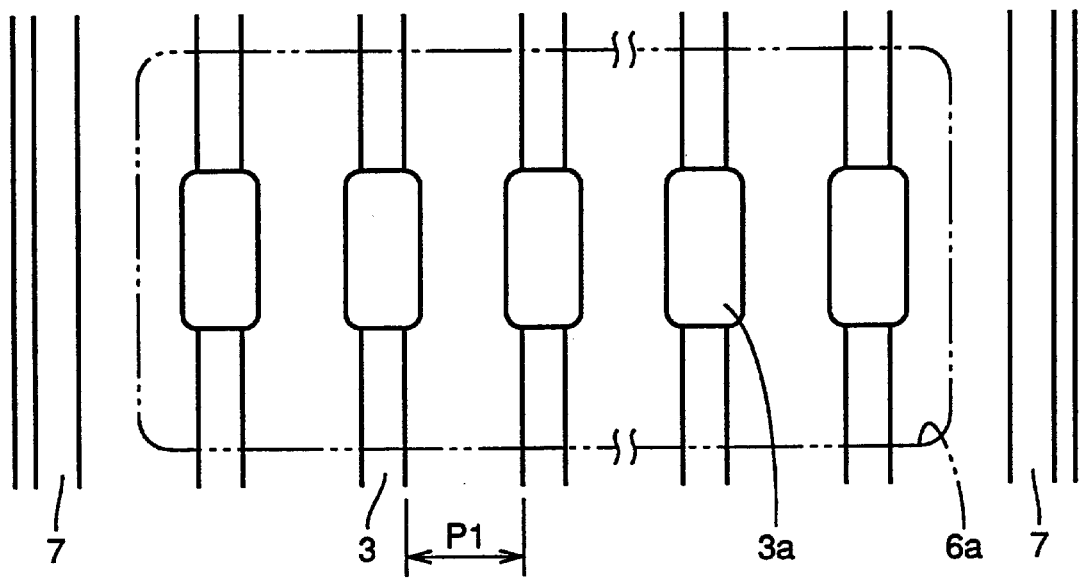
FIG. 16 is a plan view showing a shape of a blow trace in one embodiment.

Consequently, all of fuse layers 3 can have a same, symmetrical profile in cross section and thus a symmetrical profile of light absorption. Thus, blow traces 4a can all have a rectangular profile, as shown in FIG. 16, and accordingly the spacing between fuse layers 3 can be reduced.

Figure 17:
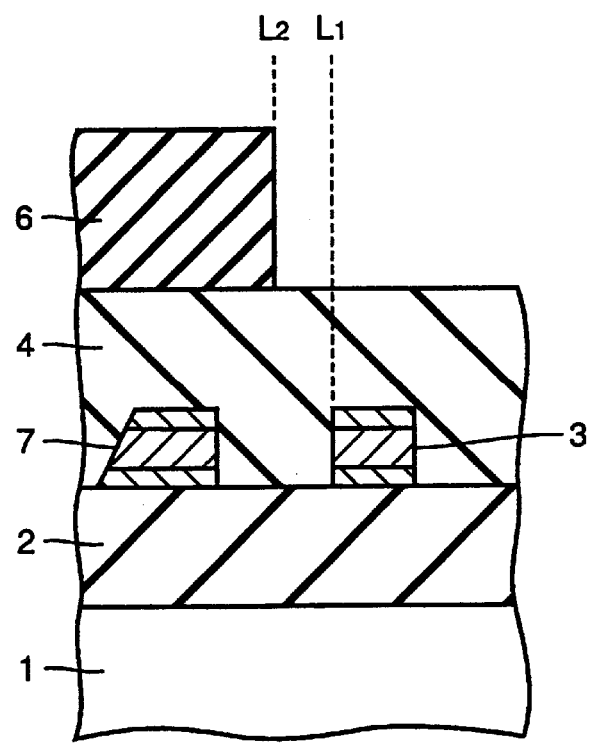
FIG. 17 is a cross section showing a relation between a position of a side surface of an opening 6$a$ provided in a protection film 6 (denoted as L2 in the figure) and a position of a fuse layer 3 side surface facing to a pseudo fuse layer 7 (denoted as L1 in the figure).

Since pseudo fuse layer 7 is not disconnected by laser light 5, protection film 6 can be provided to cover pseudo fuse layer 7. As shown in FIG. 17, the position of a side surface of opening 6a provided in protection film 6 (i.e. L2 in the figure) is only required to be closer to pseudo fuse layer 7 than the position of the fuse layer 3 side surface facing pseudo fuse layer 7 (i.e., Li in the figure) to pseudo fuse layer 7.

Accordingly, the area of opening 6a can be designed depending on fuse layer 3 rather than pseudo fuse layer 7. Thus, the area of opening 6a can be reduced and accordingly the semiconductor device can be miniaturized.

The area reduction of opening 6a renders it difficult for water and the like to enter the semiconductor device so that the water resistance of the semiconductor device can be improved.

When fuse layer 3 is disconnected with pseudo fuse layer 7 provided as described above, however, blow trace 4a has a round profile with a probability. For example, when the spacing between fuse layers 3 (denoted by P1 in FIG. 16) is 6.5 μm, the probability that blow trace 4a has a round profile, referred to the probability of large-hole creation hereinafter, is 0.65% without pseudo fuse layer 7 provided and 0.15% with pseudo fuse layer 7 provided. That is, the probability of large-hole creation with pseudo fuse layer 7 provided can only be approximately one fourth of that without pseudo fuse layer 7 provided.

Figure 18:
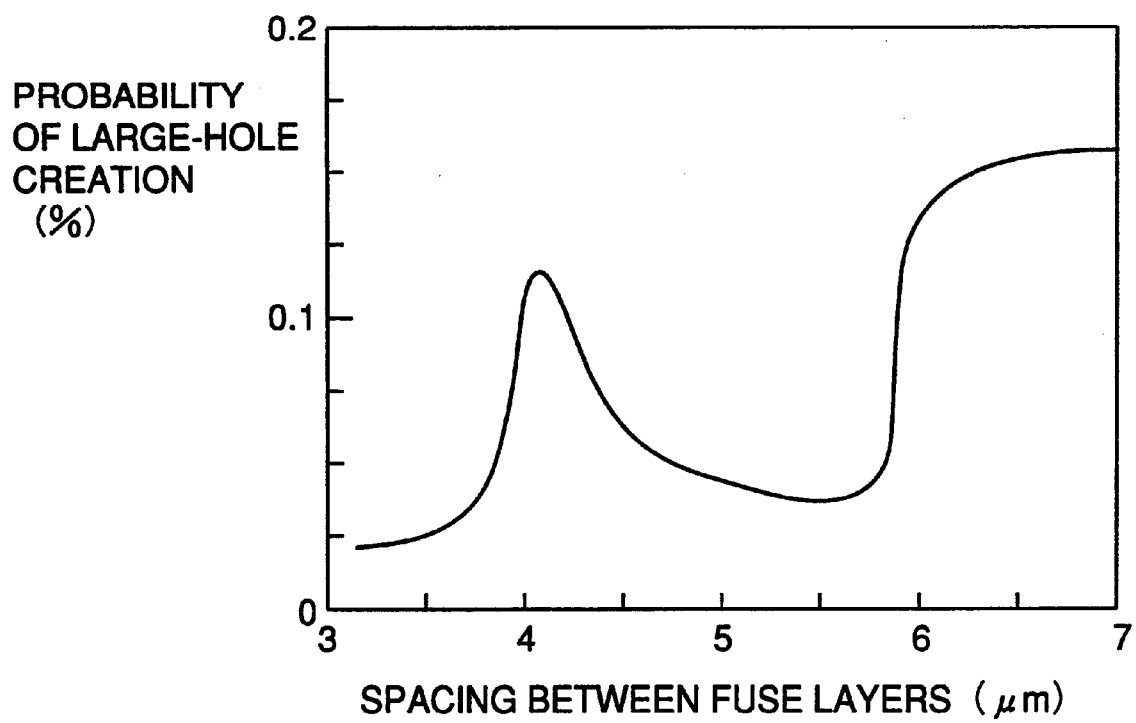
FIG. 18 is a graph of the probability that a large hole is created (%) versus the spacing between fuse layers ($\mu$m).
Figure 19:
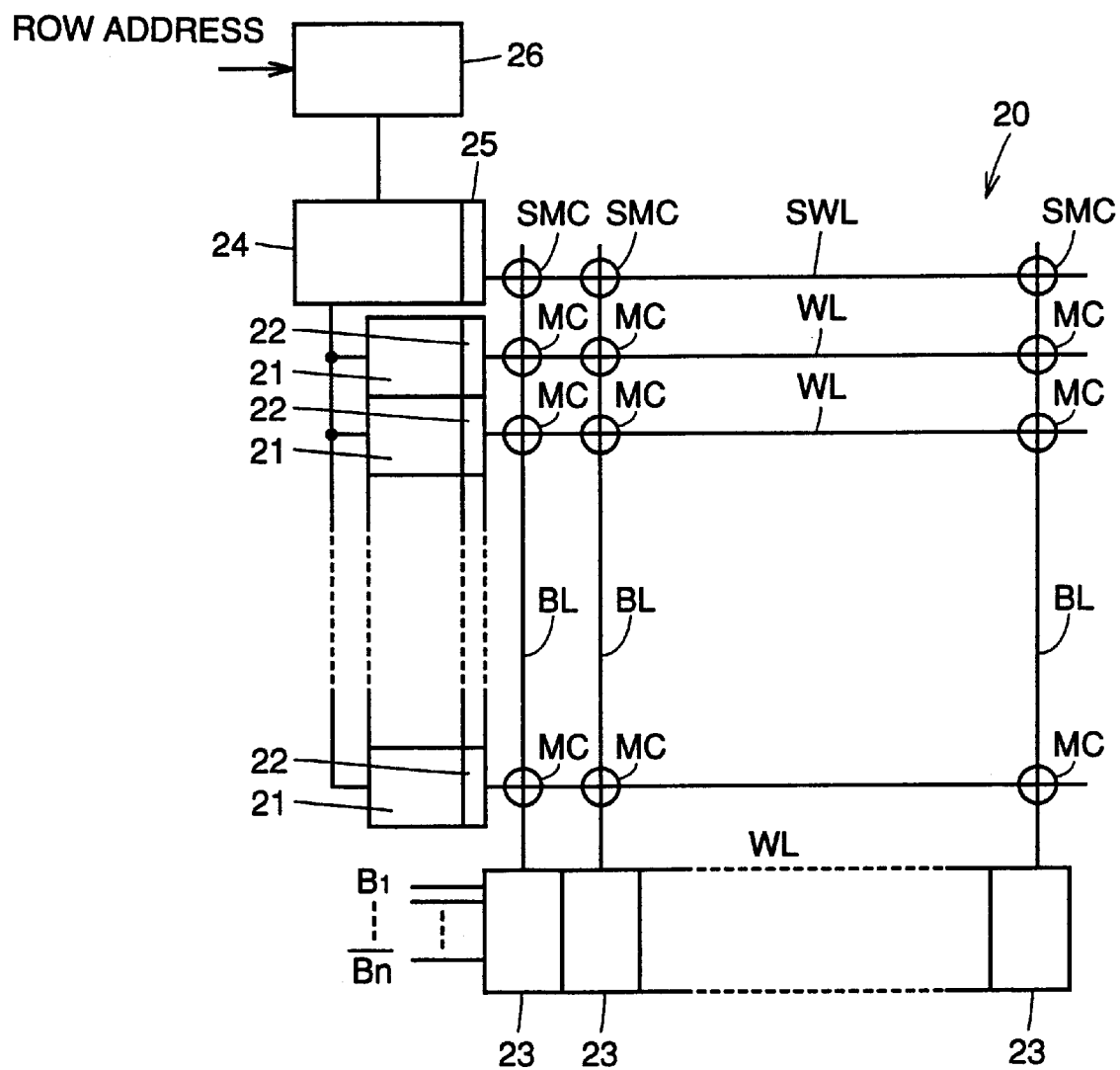
FIG. 19 is a block diagram showing a schematic configuration of a Dynamic Random Access Memory (DRAM).
Figure 20:
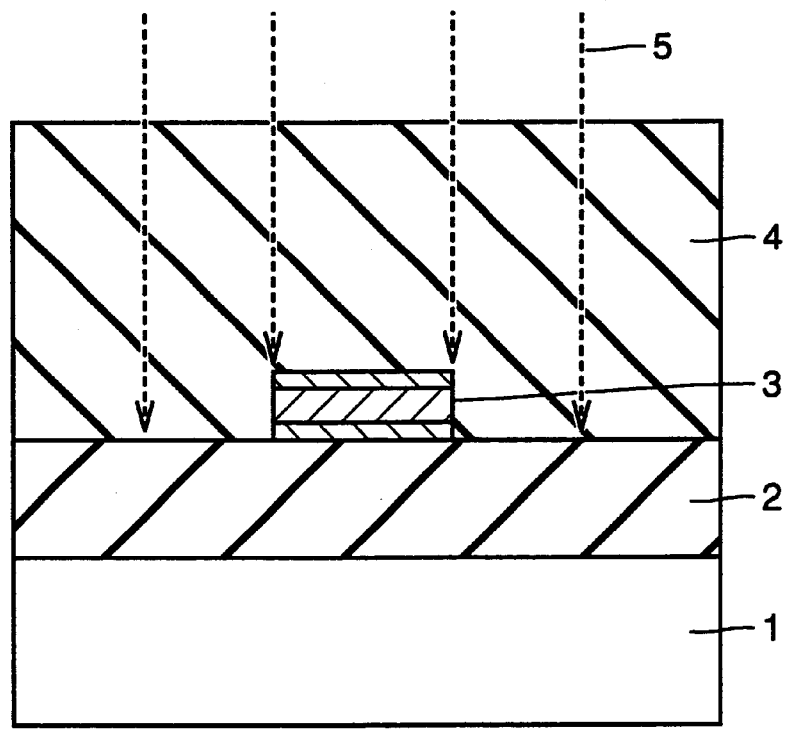
FIG. 20 is a cross section of a conventional fuse layer and a vicinity thereof.
Figure 21:
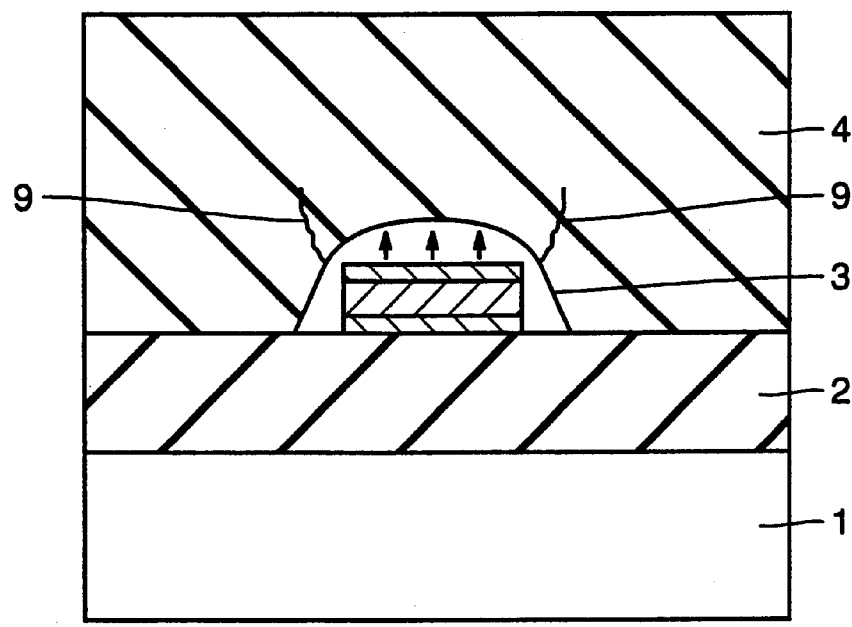
FIGS. 21 and 22 are first and second cross sections showing how the conventional fuse layer is disconnected.
Figure 22:
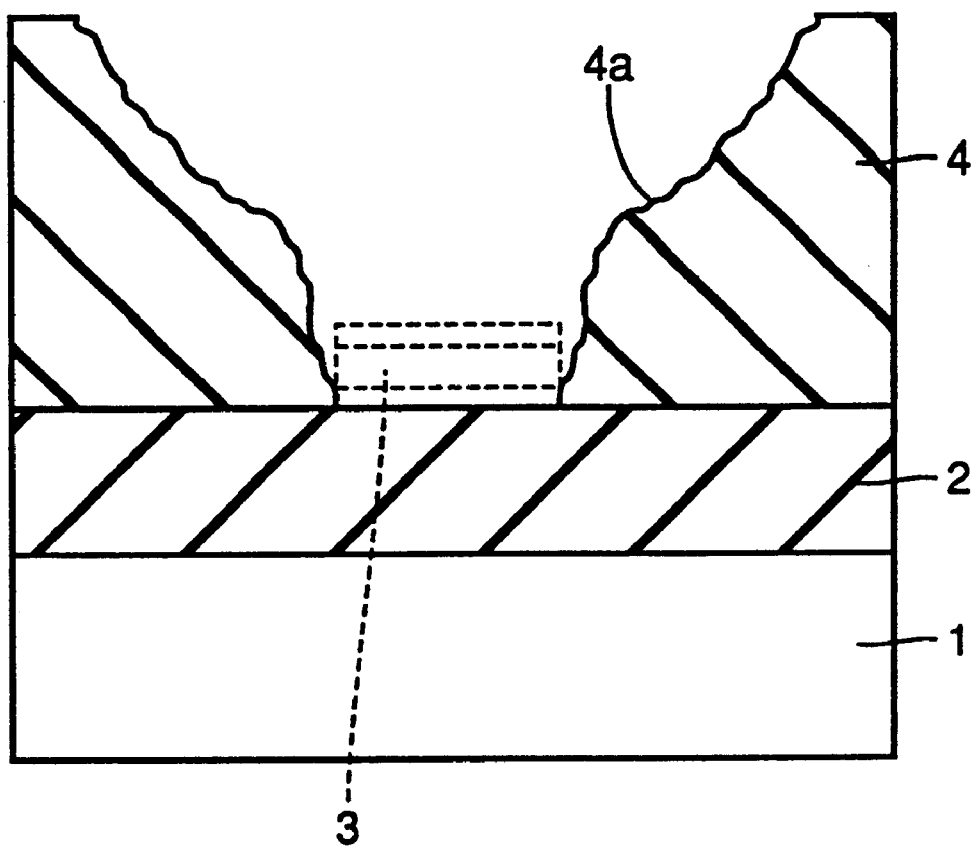

FIG. 18 is a graph of the probability of large-hole creation (%) versus the spacing between fuse layers 3 (μm). As is apparent from the figure, the probability of large-hole creation can be reduced to approximately 0.025% when fuse layers 3 have a spacing of less than 4 μm, and it can be reduced to approximately 0.04% when fuse layers 3 have a spacing of 4.5 μm to 5.5 μm. Thus, it can be said that a preferable spacing between fuse layers 3 of the semiconductor device according to the present embodiment is less than 4 μm or 4.5 μm to 5.5 μm.

It should be noted that pseudo fuse layer 7 may or may not be connected to any circuits. Although pseudo fuse layer 7 and fuse layer 3 are same in film material in view of production efficiency, they may be different in film material as long as they are formed through the same patterning step.

Since pseudo fuse layer 7 does not function as fuse layer 3, the width of pseudo fuse layer 7 may have any value larger than the limit of resolution in transferring the pattern therefor. Thus, the width of pseudo fuse layer 7 can be equal to all or less than that of fuse layer 3.

While the above description has been provided with a DRAM as one example of the semiconductor devices to which fuse layer 3 and pseudo fuse layer 7 are applied, fuse layer 3 and pseudo fuse layer 7 are applicable to not only DRAMs but various semiconductor devices with a fuse layer, such as ERAMs.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a first insulation layer;

a plurality of fuse layers extending on said first insulation layer in one direction and having a spacing from the group consisting of less than 4 μm and 4.5 μm to 5.5 μm, disconnected through light radiation to control a redundant circuit;

a single pseudo fuse layer on said first insulation layer extending along each side of said plurality of fuse layers;

a second insulation layer covering said fuse layers and said pseudo fuse layer; and a protection film on said second insulation layer, having an opening in a region opposite to said fuse layers.

2. The semiconductor device according to claim 1, wherein a surface of said pseudo fuse layer opposite to another surface of said pseudo fuse layer facing said fuse layer is inclined so that said pseudo fuse layer said surface is tapered upwards.

3. The semiconductor device according to claim 1, wherein:

said fuse layer has a stacked structure formed by at least two layers with a layer as a surface of said fuse layer formed of a material with a high boiling point; and said pseudo fuse layer has a same said stacked structure as said fuse layer.

4. The semiconductor device according to claim 3, wherein said fuse layer and said pseudo fuse layer each have a three-layered structure formed by a nitride layer, a metal layer and a nitride layer, a material for said nitride layer being higher in boiling point than a material for said metal layer.

5. The semiconductor device according to claim 1, wherein a width of said pseudo fuse layer is at most a width of said fuse layer.

6. The semiconductor device according to claim 1, wherein a sidewall of said opening in said protection film opposite to a side of said fuse layer is provided between a surface of said fuse layer opposite to said pseudo fuse layer and a surface of said pseudo fuse layer opposite to said fuse layer.

* * * * *